(12) United States Patent
Maier et al.

(10) Patent No.: US 9,725,303 B1
(45) Date of Patent: Aug. 8, 2017

(54) SEMICONDUCTOR DEVICE INCLUDING A MEMS DIE AND A CONDUCTIVE LAYER

(71) Applicant: Infineon Technologies AG, Neubiberg (DE)

(72) Inventors: Dominic Maier, Pleystein (DE); Franz-Xaver Muehlbauer, Rimbach (DE); Thomas Kilger, Regenstauf (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/071,882

(22) Filed: Mar. 16, 2016

(51) Int. Cl.
| | |
|---|---|
| *H01L 21/50* | (2006.01) |
| *H01L 23/49* | (2006.01) |
| *B81B 7/00* | (2006.01) |
| *B81C 1/00* | (2006.01) |
| *H04R 19/00* | (2006.01) |
| *H04R 1/28* | (2006.01) |

(52) U.S. Cl.
CPC ........ *B81B 7/0064* (2013.01); *B81C 1/00301* (2013.01); *H04R 1/28* (2013.01); *H04R 19/005* (2013.01); *B81B 2201/0257* (2013.01); *B81B 2203/0127* (2013.01); *B81B 2207/012* (2013.01); *B81B 2207/094* (2013.01); *B81B 2207/095* (2013.01); *H04R 2201/003* (2013.01)

(58) Field of Classification Search
CPC ...... H04R 19/00; H04R 19/005; H04R 19/04; H01L 23/49; H01L 23/495; H01L 21/50
USPC .......................................................... 257/416
See application file for complete search history.

(56) References Cited

U.S. PATENT DOCUMENTS

| | | | |
|---|---|---|---|
| 7,898,043 B2* | 3/2011 | Ziglioli ................. | B81B 7/0061 257/414 |
| 9,078,063 B2* | 7/2015 | Loeppert ................. | H04R 1/04 |
| 2010/0087024 A1* | 4/2010 | Hawat ................... | B81B 7/0077 438/51 |
| 2014/0339656 A1* | 11/2014 | Schlarmann .......... | G01L 9/0042 257/415 |

* cited by examiner

*Primary Examiner* — Monica D Harrison
(74) *Attorney, Agent, or Firm* — Dicke, Billig & Czaja, PLLC

(57) ABSTRACT

A semiconductor device includes a microelectromechanical system (MEMS) die, an encapsulation material, a via element, a non-conductive lid, and a conductive layer. The encapsulation material laterally surrounds the MEMS die. The via element extends through the encapsulation material. The non-conductive lid is over the MEMS die and defines a cavity. The conductive layer is over the MEMS die and the encapsulation material and is electrically coupled to the via element.

17 Claims, 5 Drawing Sheets

SEMICONDUCTOR DEVICE INCLUDING A MEMS DIE AND A CONDUCTIVE LAYER

BACKGROUND

Semiconductor devices including a microelectromechanical system (MEMS) may include a cavity, which serves to protect a vibrating surface or membrane of the MEMS. At the same time, the MEMS should be protected against electromagnetic interference.

For these and other reasons, there is a need for the present invention.

SUMMARY

One example of a semiconductor device includes a microelectromechanical system (MEMS) die, an encapsulation material, a via element, a non-conductive lid, and a conductive layer. The encapsulation material laterally surrounds the MEMS die. The via element extends through the encapsulation material. The non-conductive lid is over the MEMS die and defines a cavity. The conductive layer is over the MEMS die and the encapsulation material and is electrically coupled to the via element.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

Semiconductor devices including a microelectromechanical system (MEMS) die may include a metal lid to both provide a cavity to protect a vibrating surface or membrane of the MEMS die and to provide electromagnetic shielding for the MEMS die and/or other components of the semiconductor device. As the size of semiconductor devices including a MEMS die continues to shrink, the metal lids become more difficult to fabricate to provide the desired cavity shape and volume. Accordingly, as described herein, semiconductor devices including a MEMS die use a non-conductive lid to define the cavity and a separate conductive layer to provide the electromagnetic shielding. The non-conductive lid enables the lid to be fabricated using a molding process or another suitable process to provide the desired cavity shape and volume. The conductive layer providing the electromagnetic shielding enables several options for the arrangement of the conductive layer within the semiconductor device.

Figure 1A:
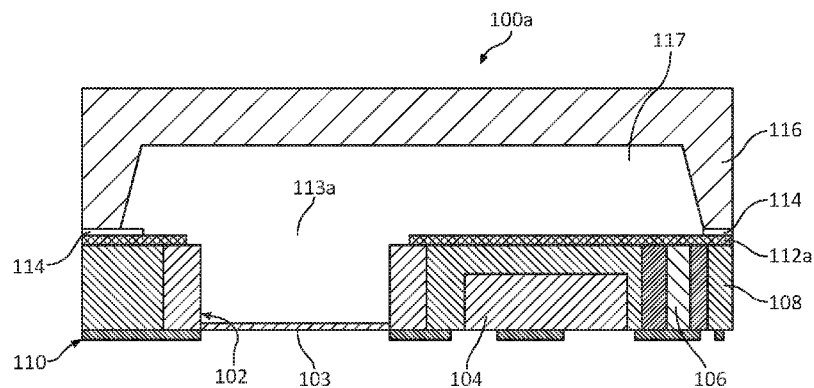
FIG. 1A illustrates a cross-sectional view of one example of a semiconductor device including a microelectromechanical system (MEMS) die.

FIG. 1A illustrates a cross-sectional view of one example of a semiconductor device 100a. Semiconductor device 100a includes a MEMS die 102, an integrated circuit die 104, a via element 106, encapsulation material 108, a redistribution layer 110, a conductive layer 112a, and a non-conductive lid 116. In other examples, integrated circuit die 104 may be excluded. MEMS die 102 includes a membrane 103. In one example, MEMS die 102 includes a microphone and membrane 103 is used to sense a sound signal. Integrated circuit die 104 may be an application specific integrated circuit (ASIC) die to process the signal sensed by MEMS die 102.

Encapsulation material 108 laterally surrounds MEMS die 102, integrated circuit die 104, and via element 106. In one example, encapsulation material 108 encapsulates the top surface of integrated circuit die 104. Encapsulation material 108 may include a mold compound, a polymer, or another suitable dielectric material. Redistribution layer 110 is formed on the bottom surface of encapsulation material 108, MEMS die 102, integrated circuit die 104, and via element 106. Redistribution layer 110 may electrically interconnect MEMS die 102, integrated circuit die 104, and/or via element 106. Redistribution layer 110 includes signal traces and contact elements for electrically coupling semiconductor device 100a to a circuit board, such as a printed circuit board (PCB).

Conductive layer 112a is attached to the top surface of encapsulation material 108, MEMS die 102, and via element 106. Conductive layer 112a provides electromagnetic shielding for MEMS die 102 and/or integrated circuit die 104. Conductive layer 112a includes an opening 113a over membrane 103 of MEMS die 102. In one example, conductive layer 112a is a conductive tape, foil, or film that is applied onto the top surface of encapsulation material 108, MEMS die 102, and via element 106 via an electrically conductive adhesive material or another suitable material. In another example, conductive layer 112a is applied onto the top surface of encapsulation material 108, MEMS die 102, and via element 106 using a deposition process (e.g., physical vapor deposition), a plating process (e.g., electroless plating), or another suitable process. Conductive layer 112a may be structured after being applied to the top surface of encapsulation material 108, MEMS die 102, and via element 106 using a lithography process. Conductive layer 112a is electrically coupled to via element 106.

Via element 106 extends through encapsulation material 108 to electrically couple conductive layer 112a to redistribution layer 110. Via element 106 may be used to electrically couple conductive layer 112a to a common or ground. In one example, via element 106 may be prefabricated (e.g., a via bar or an embedded z-line (EZL)) and encapsulated in encapsulation material 108 with MEMS die 102 and integrated circuit die 104. In another example, via element 106 may be formed after encapsulating MEMS die 102 and integrated circuit die 104, such as by drilling a through-hole through encapsulation material 108 and filling the through-hole with a conductive material. In yet other examples, via element 106 may include another suitable electrically conductive element to electrically couple conductive layer 112a to redistribution layer 110.

Non-conductive lid 116 is attached to the top surface of conductive layer 112a via a material 114, such as a glue, an adhesive tape, or another suitable material. Non-conductive lid 116 defines a cavity 117 over MEMS die 102, integrated circuit die 104, and encapsulation material 108. Cavity 117 may provide a back volume for MEMS die 102. Lid 116 includes a non-conductive material, such as a mold compound, a polymer, or another suitable dielectric material. In one example, non-conductive lid 116 includes the same material as encapsulation material 108. In other examples, non-conductive lid 116 includes a different material from encapsulation material 108.

Figure 1B:
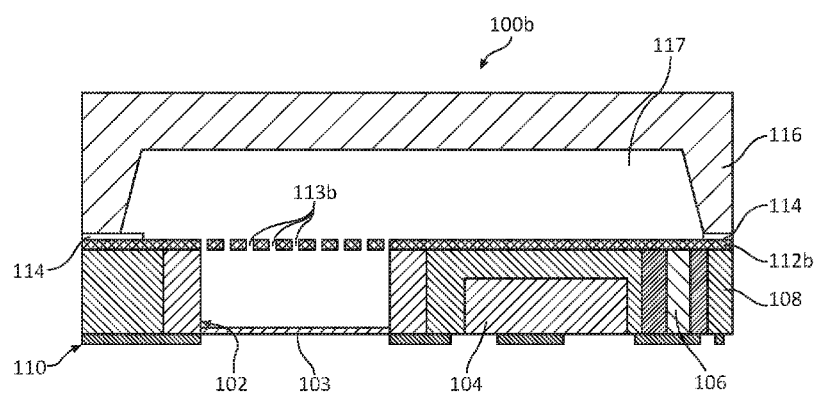
FIG. 1B illustrates a cross-sectional view of another example of a semiconductor device including a MEMS die.

FIG. 1B illustrates a cross-sectional view of another example of a semiconductor device 100b. Semiconductor device 100b is similar to semiconductor device 100a previously described and illustrated with reference to FIG. 1A, except that semiconductor device 100b includes a conductive layer 112b in place of conductive layer 112a. Conductive layer 112b is attached to the top surface of encapsulation material 108, MEMS die 102, and via element 106. Conductive layer 112b provides electromagnetic shielding for MEMS die 102 and/or integrated circuit die 104. Conductive layer 112b includes a plurality of openings 113b over membrane 103 of MEMS die 102. In one example, conductive layer 112b is a conductive tape, foil, film, or mesh that is applied onto the top surface of encapsulation material 108, MEMS die 102, and via element 106 via an electrically conductive adhesive material or another suitable material. Conductive layer 112b is electrically coupled to via element 106.

Figure 2:
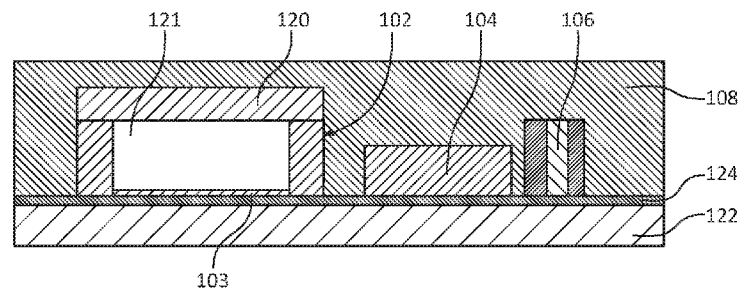
FIGS. 2-5 illustrate one example of a method for fabricating the semiconductor devices of FIGS. 1A and 1B.

FIGS. 2-5 illustrate one example of a method for fabricating semiconductor devices 100a and 100b of FIGS. 1A and 1B, respectively. FIG. 2 illustrates a cross-sectional view of one example of a semiconductor device after a first stage of the fabrication process. A carrier 122 with a carrier tape 124 applied to the upper surface of the carrier is provided. A MEMS die 102 including a cap 120, an integrated circuit die 104, and a via element 106 are then placed on the carrier tape 124. The cap 120 of MEMS die 102 protects a cavity 121 between cap 120 and membrane 103. MEMS die 102 including cap 120, integrated circuit die 104, and via element 106 are then encapsulated with an encapsulation material 108 to provide the semiconductor device after the first stage of the fabrication process as illustrated in FIG. 2.

Figure 3:
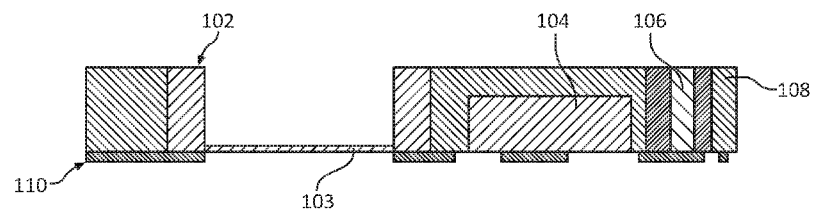

FIG. 3 illustrates a cross-sectional view of one example of the semiconductor device after a second stage of the fabrication process. Encapsulation material 108 is partially removed and cap 120 is removed using a grinding process or another suitable process to expose an upper surface of MEMS die 102 and an upper surface of via element 106. Carrier 122 and carrier tape 124 is also removed. A redistribution layer 110 is formed on the lower surface of MEMS die 102, integrated circuit die 104, via element 106, and encapsulation material 108 to provide the semiconductor device after the second stage of the fabrication process as illustrated in FIG. 3.

Figure 4A:
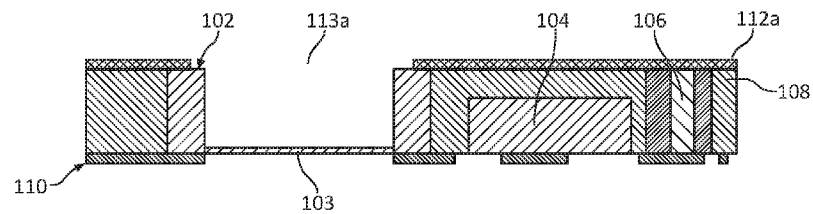

FIG. 4A illustrates a cross-sectional view of one example of a semiconductor device after a third stage of the fabrication process. A conductive layer 112a is applied to the upper surface of MEMS die 102, via element 106, and encapsulation material 108. As previously described and illustrated with reference to FIG. 1A, conductive layer 112a includes an opening 113a over membrane 103 of MEMS die 102.

Figure 4B:
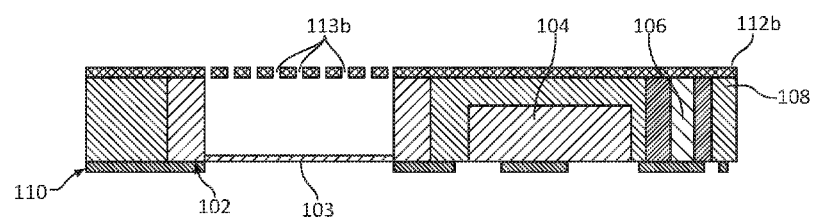

FIG. 4B illustrates a cross-sectional view of another example of a semiconductor device after a third stage of the fabrication process. A conductive layer 112b is applied to the upper surface of MEMS die 102, via element 106, and encapsulation material 108. As previously described and illustrated with reference to FIG. 1B, conductive layer 112b includes a plurality of openings 113b over membrane 103 of MEMS die 102.

Figure 5:
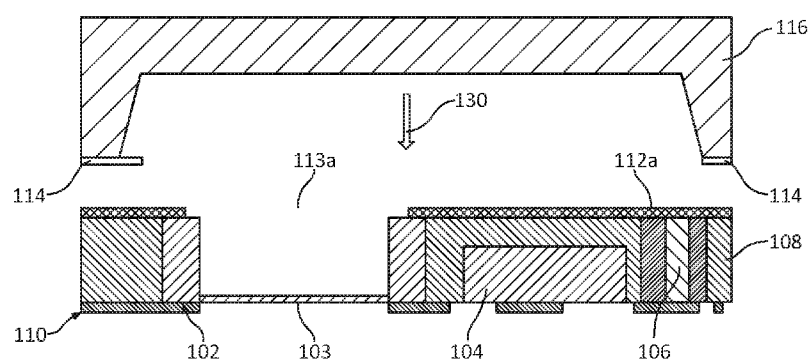

FIG. 5 illustrates a cross-sectional view of one example of a semiconductor device just prior to attaching a non-conductive lid 116. While the semiconductor device illustrated in FIG. 5 includes conductive layer 112a, in other examples, the semiconductor device may include conductive layer 112b in place of conductive layer 112a. A material 114 for attaching non-conductive lid 116 to conductive layer 112a is applied to the lower surface of lid 116. Non-conductive lid 116 is then lowered onto the top surface of conductive layer 112a as indicated by arrow 130 to provide semiconductor device 110a previously described and illustrated with reference to FIG. 1A.

Figure 6:
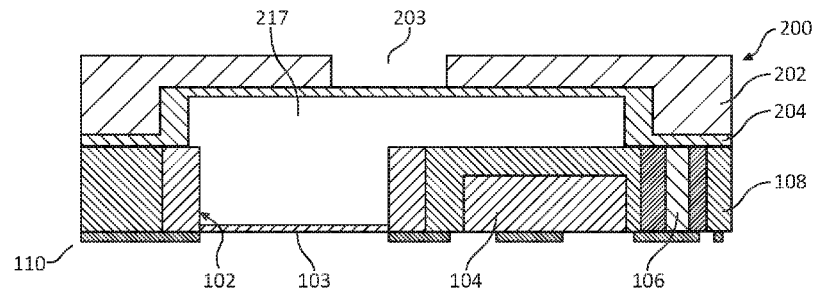
FIG. 6 illustrates a cross-sectional view of another example of a semiconductor device including a MEMS die.

FIG. 6 illustrates a cross-sectional view of another example of a semiconductor device 200. Semiconductor device 200 includes a MEMS die 102, an integrated circuit die 104, a via element 106, encapsulation material 108, and a redistribution layer 110 as previously described and illustrated with reference to FIG. 1A. In addition, semiconductor device 200 includes a non-conductive lid 202 and a conductive layer 204. Non-conductive lid 202 may include a through-hole 203. Conductive layer 204 is attached to the inner surfaces of lid 202 and extends across through-hole 203 such that conductive layer 204 is between lid 202 and MEMS die 102. Conductive layer 204 is electrically coupled to via element 106.

Conductive layer 204 provides electromagnetic shielding for MEMS die 102 and/or integrated circuit die 104. In one example, conductive layer 204 is a conductive tape, foil, or film that is applied onto the inner surfaces of non-conductive lid 202 via an adhesive material or another suitable material. In another example, conductive layer 204 is applied onto to the inner surfaces of non-conductive lid 202 using a deposition process (e.g., physical vapor deposition), a plating process (e.g., electroless plating), or another suitable process. Conductive layer 204 may be structured after being applied to non-conductive lid 202 using a lithography process.

Non-conductive lid 202 with conductive layer 204 defines a cavity 217 over MEMS die 102, integrated circuit die 104, and encapsulation material 108. Cavity 217 may provide a back volume for MEMS die 102. Lid 202 includes a non-conductive material, such as a mold compound, a polymer, or another suitable dielectric material. In one example, non-conductive lid 202 includes the same material as encapsulation material 108. In other examples, non-conductive lid 202 includes a different material from encapsulation material 108.

Figure 7A:
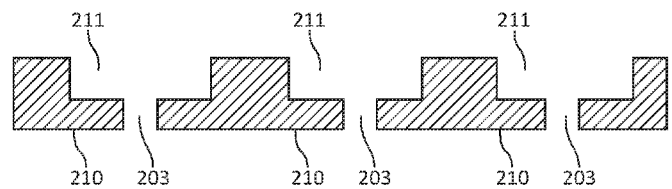
FIGS. 7A-7D illustrate one example of a method for fabricating a lid for the semiconductor device of FIG. 6.
Figure 7B:
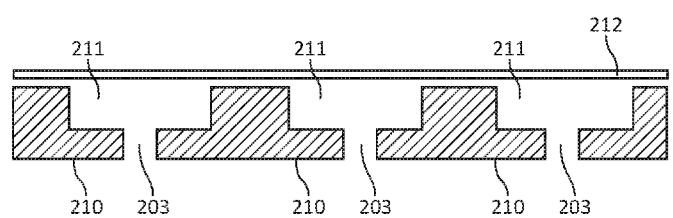

FIGS. 7A-7D illustrate one example of a method for fabricating non-conductive lid 202 with conductive layer 204 of semiconductor device 200 previously described and illustrated with reference to FIG. 6. FIG. 7A illustrates a cross-sectional view of one example of a plurality of partially fabricated lids 210 connected to each other. In a batch process, a plurality of non-conductive lids 210 each defining a cavity 211 and a through hole 203 are formed using a molding process, a milling process, or another suitable process. FIG. 7B illustrates a cross-sectional view of one example of the plurality of non-conductive lids 210 of FIG. 7A with a conductive tape 212 extending over cavities 211. Conductive tape 212 includes a conductive layer (e.g., foil, film) with an adhesive material on the conductive layer facing the non-conductive lids 210.

Figure 7C:
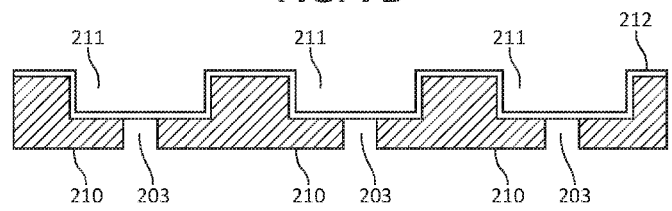
Figure 7D:
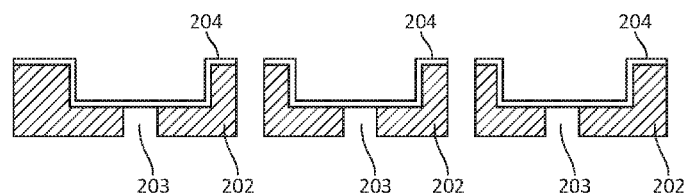

FIG. 7C illustrates a cross-sectional view of one example of the plurality of non-conductive lids 210 after the conductive tape 212 is deep-drawn onto lids 210. In one example, a vacuum applied to through-holes 203 is used to deep-draw conductive tape 212 into cavities 211 of non-conductive lids 210 to attach conductive tape 212 to lids 210. FIG. 7D illustrates a cross-sectional view of one example of a plurality of completed lids 202 with conductive layers 204. Non-conductive lids 210 with conductive layer 212 of FIG. 7C are singulated to provide the completed non-conductive lids 202 with attached conductive layers 204. Each lid 202 with conductive layer 204 may then be attached to a MEMS die 102, via element 106, and encapsulation material 108 as previously described and illustrated with reference to FIG. 6.

Figure 8:
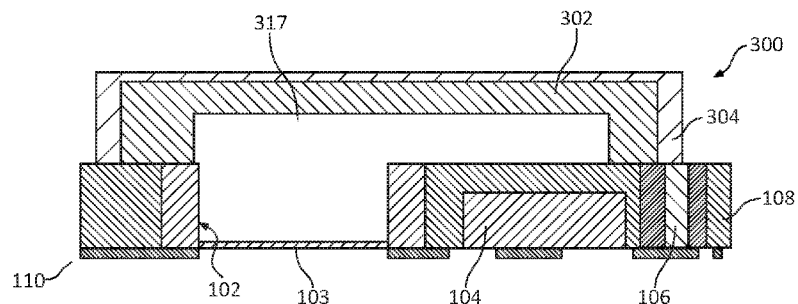
FIG. 8 illustrates a cross-sectional view of another example of a semiconductor device including a MEMS die.

FIG. 8 illustrates a cross-sectional view of another example of a semiconductor device 300. Semiconductor device 300 is similar to semiconductor device 200 previously described and illustrated with reference to FIG. 6, except that semiconductor device 300 includes a non-conductive lid 302 and a conductive layer 304 in place of non-conductive lid 202 and conductive layer 204. Conductive layer 304 is attached to the outer surfaces of lid 302 such that lid 302 is between conductive layer 304 and MEMS die 102. Conductive layer 304 is electrically coupled to via element 106.

Conductive layer 304 provides electromagnetic shielding for MEMS die 102 and/or integrated circuit die 104. In one example, conductive layer 304 is a conductive tape, foil, or film that is applied onto the outer surfaces of non-conductive lid 302 via an adhesive material or another suitable material. In another example, conductive layer 304 is applied onto the outer surfaces of non-conductive lid 302 using a deposition process (e.g., physical vapor deposition), a plating process (e.g., electroless plating), or another suitable process. Conductive layer 304 may be structured after being applied to non-conductive lid 302 using a lithography process.

Non-conductive lid 302 defines a cavity 317 over MEMS die 102, integrated circuit die 104, and encapsulation material 108. Cavity 317 may provide a back volume for MEMS die 102. Lid 302 includes a non-conductive material, such as a mold compound, a polymer, or another suitable dielectric material. In one example, non-conductive lid 302 includes the same material as encapsulation material 108. In other examples, non-conductive lid 302 includes a different material from encapsulation material 108.

Figure 9A:
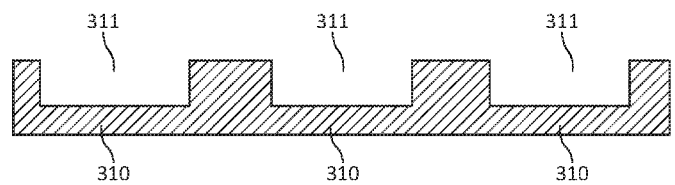
FIGS. 9A-9D illustrate one example of a method for fabricating a lid for the semiconductor device of FIG. 8.
Figure 9B:
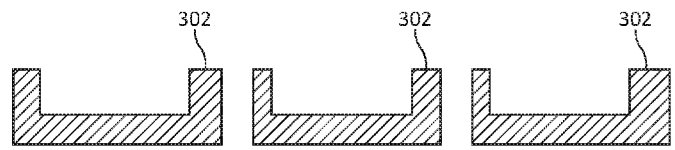

FIGS. 9A-9D illustrate one example of a method for fabricating non-conductive lid 302 with conductive layer 304 of semiconductor device 300 previously described and illustrated with reference to FIG. 8. FIG. 9A illustrates a cross-sectional view of one example of a plurality of partially fabricated lids 310 connected to each other. In a batch process, a plurality of non-conductive lids 310 each defining a cavity 311 are formed using a molding process, a milling process, or another suitable process. FIG. 9B illustrates a cross-sectional view of one example of a plurality of non-conductive lids 302 after singulation. Non-conductive lids 310 of FIG. 9A are singulated to provide the completed non-conductive lids 302.

Figure 9C:
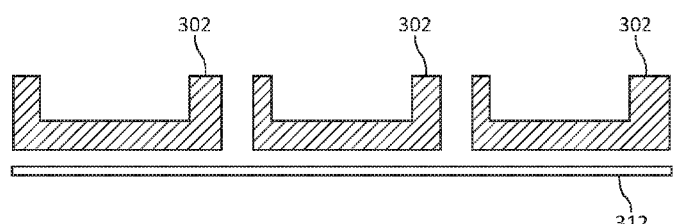
Figure 9D:
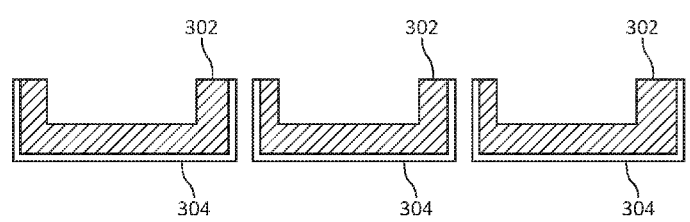

FIG. 9C illustrates a cross-sectional view of one example of the plurality of non-conductive lids 302 of FIG. 9B with a conductive tape 312 extending under the lids 302. Conductive tape 312 includes a conductive layer (e.g., foil, film) with an adhesive material on the conductive layer facing the non-conductive lids 302. FIG. 9D illustrates a cross-sectional view of one example of a plurality of completed non-conductive lids 302 with attached conductive layers 304. In one example, a vacuum applied between lids 302 is used to deep-draw conductive tape 312 onto non-conductive lids 302. The conductive tape between non-conductive lids 302 is then removed. Each lid 302 with conductive layer 304 may then be attached to a MEMS die 102, via element 106, and encapsulation material 108 as previously described and illustrated with reference to FIG. 8.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a microelectromechanical system (MEMS) die;
   an encapsulation material laterally surrounding the MEMS die;
   a conductive via element extending through the encapsulation material;
   a non-conductive lid over the MEMS die, the lid defining a cavity;
   a conductive layer over the MEMS die and the encapsulation material, the conductive layer electrically coupled to the conductive via element, and
   wherein the conductive layer is directly attached to the via element, the encapsulation material, and the MEMS die.

2. The semiconductor device of claim 1, wherein the conductive layer comprises an opening over a membrane of the MEMS die.

3. The semiconductor device of claim 1, wherein the conductive layer comprises a plurality of openings over a membrane of the MEMS die.

4. The semiconductor device of claim 1, wherein the conductive layer is directly attached to an entire inner surface of the lid.

5. The semiconductor device of claim 1, wherein the conductive layer comprises a conductive tape.

6. A semiconductor device comprising:
   a microelectromechanical system (MEMS) die;
   an encapsulation material laterally surrounding the MEMS die;
   a via element extending through the encapsulation material;
   a non-conductive lid over the MEMS die, the lid defining a cavity;
   a conductive layer over the MEMS die and the encapsulation material, the conductive layer electrically coupled to the via element, wherein the conductive layer is attached to an inner surface of the lid,
wherein the lid comprises a through-hole, and
wherein the conductive layer extends over the through-hole.

7. A semiconductor device comprising:
a microelectromechanical system (MEMS) die;
an encapsulation material laterally surrounding the MEMS die;
a via element extending through the encapsulation material;
a non-conductive lid over the MEMS die, the lid defining a cavity;
a conductive layer over the MEMS die and the encapsulation material, the conductive layer electrically coupled to the via element, and
wherein the conductive layer is directly attached to an entire outer surface of the lid.

8. A semiconductor device comprising:
a microelectromechanical system (MEMS) die comprising a membrane;
an integrated circuit die;
an encapsulation material laterally surrounding the MEMS die and the integrated circuit die;
a conductive via element extending through the encapsulation material;
a non-conductive lid over the MEMS die and the integrated circuit die, the lid defining a cavity; and
a conductive layer over the MEMS die, the integrated circuit die, and the encapsulation material, the conductive layer electrically coupled to the conductive via element and directly attached to the MEMS die.

9. The semiconductor device of claim 8, wherein the conductive layer provides electromagnetic shielding for the MEMS die.

10. The semiconductor device of claim 8, further comprising:
a redistribution layer electrically coupled and directly attached to the MEMS die, the integrated circuit die, and the via element.

11. The semiconductor device of claim 8, wherein the non-conductive lid comprises an encapsulation material.

12. The semiconductor device of claim 8, wherein the MEMS die comprises a microphone.

13. The semiconductor device of claim 12, wherein the cavity provides a back volume for the microphone.

14. A method for fabricating a semiconductor device, the method comprising:
encapsulating a microelectromechanical system (MEMS) die and a via element with an encapsulation material;
electrically coupling a conductive layer to the via element, the conductive layer to electromagnetically shielding the MEMS die;
attaching a non-conductive lid over the MEMS die,
attaching the conductive layer to the non-conductive lid prior to attaching the lid over the MEMS die, and
wherein attaching the conductive layer to the non-conductive lid comprises deep-drawing a conductive tape over the non-conductive lid.

15. The method of claim 14, wherein attaching the conductive layer to the non-conductive lid comprises attaching the conductive layer to an inner surface of the non-conductive lid.

16. The method of claim 14, wherein attaching the conductive layer to the non-conductive lid comprises attaching the conductive layer to an outer surface of the non-conductive lid.

17. The method of claim 14, further comprising:
attaching the conductive layer to the MEMS die and the encapsulation material, the conductive layer comprising at least one opening over a membrane of the MEMS die.

* * * * *